(12) United States Patent
Yoshida

(10) Patent No.: US 7,616,417 B2
(45) Date of Patent: Nov. 10, 2009

(54) SEMICONDUCTOR DEVICE INCLUDING PROTECTION CIRCUIT AND SWITCH CIRCUIT AND ITS TESTING METHOD

(75) Inventor: Mitsuru Yoshida, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/984,360

(22) Filed: Nov. 16, 2007

(65) Prior Publication Data

US 2008/0192390 A1    Aug. 14, 2008

(30) Foreign Application Priority Data

Feb. 9, 2007    (JP)    ............................. 2007-030287

(51) Int. Cl.
*H02H 3/20*    (2006.01)
*H02H 9/04*    (2006.01)
(52) U.S. Cl. ..................... 361/56; 361/111; 361/91.1
(58) Field of Classification Search ................. 361/111, 361/56, 91.1
See application file for complete search history.

(56) References Cited

U.S. PATENT DOCUMENTS

| 5,303,110 A | * | 4/1994 | Kumagai | ..................... 361/18 |
| 6,430,016 B1 | * | 8/2002 | Marr | ............................ 361/56 |
| 2005/0122748 A1 | * | 6/2005 | Tadokoro et al. | .............. 363/40 |

FOREIGN PATENT DOCUMENTS

| JP | 2000236022 | * | 8/2000 |
| JP | 2005-175054 A | | 6/2005 |

* cited by examiner

*Primary Examiner*—Stephen W Jackson
*Assistant Examiner*—Zeev Kitov
(74) *Attorney, Agent, or Firm*—Foley & Lardner LLP

(57) ABSTRACT

In a semiconductor device including a semiconductor element to be protected having first and second electrodes, and a protection circuit coupled between the first and second electrodes, a switch circuit is inserted between the first and second electrodes in series to the protection circuit. The switch circuit is turned ON by such a voltage that turns ON the semiconductor element.

5 Claims, 18 Drawing Sheets

SEMICONDUCTOR DEVICE INCLUDING PROTECTION CIRCUIT AND SWITCH CIRCUIT AND ITS TESTING METHOD

BACKGROUND OF THE INVENTION

1. Field of the Invention

The present invention relates to a semiconductor device including a semiconductor element with a protection circuit and its testing method.

2. Description of Related Art

In a prior art semiconductor device including a semiconductor element so-called a gate-insulating-type transistor such as a power MOS transistor and an insulated gate bipolar transistor (IGBT), if an excessive voltage is applied to the gate of the gate-insulating-type transistor, the gate insulating layer thereof would be electrostatically destroyed. Therefore, in order to prevent the gate insulating layer from being electrostatically destroyed, a protection circuit is connected between the gate and source of the gate-insulating-type transistor to clamp the difference in voltage thereof.

The protection circuit is constructed by one or more diodes, and has an anode connected to an anode pad and a cathode connected to a source pad of the gate-insulating-type transistor. The anode pad is connected by a bonding wire to a gate pad of the gate-insulating-type transistor. On the other hand, in order to remove semiconductor devices with low gate breakdown voltages, a gate breakdown voltage test operation is carried out in a wafer state before bonding the bonding wire. In this case, a predetermined test voltage is applied to the gate of a gate-insulating-type transistor to determine whether or not the gate-insulating-type transistor is normally operated.

The above-described prior art semiconductor device is disclosed in Japanese Unexamined Patent Publication (Kokai) No. P2005-175054 A. This will be explained later in detail.

However, the inventor has recognized that, since the anode pad whose size is very large, is required for the protection circuit, the above-described prior art semiconductor device becomes large in size, which would increase the manufacturing cost.

SUMMARY

The present invention seeks to solve the above-described problem.

In one embodiment, in a semiconductor device including a semiconductor element to be protected having first and second electrodes, and a protection circuit coupled between the first and second electrodes, a switch circuit is inserted between the first and second electrodes in series to the protection circuit. The switch circuit is turned ON by such a voltage that turns ON the semiconductor element.

Thus, a pad specialized for the protection circuit would be unnecessary.

BRIEF DESCRIPTION OF THE DRAWINGS

The above and other objects, advantages and features of the present invention will be more apparent from the following description of certain preferred embodiments as compared with the prior art, taken in conjunction with the accompanying drawings, wherein.

DETAILED DESCRIPTION OF PREFERRED EMBODIMENTS

Figure 1:
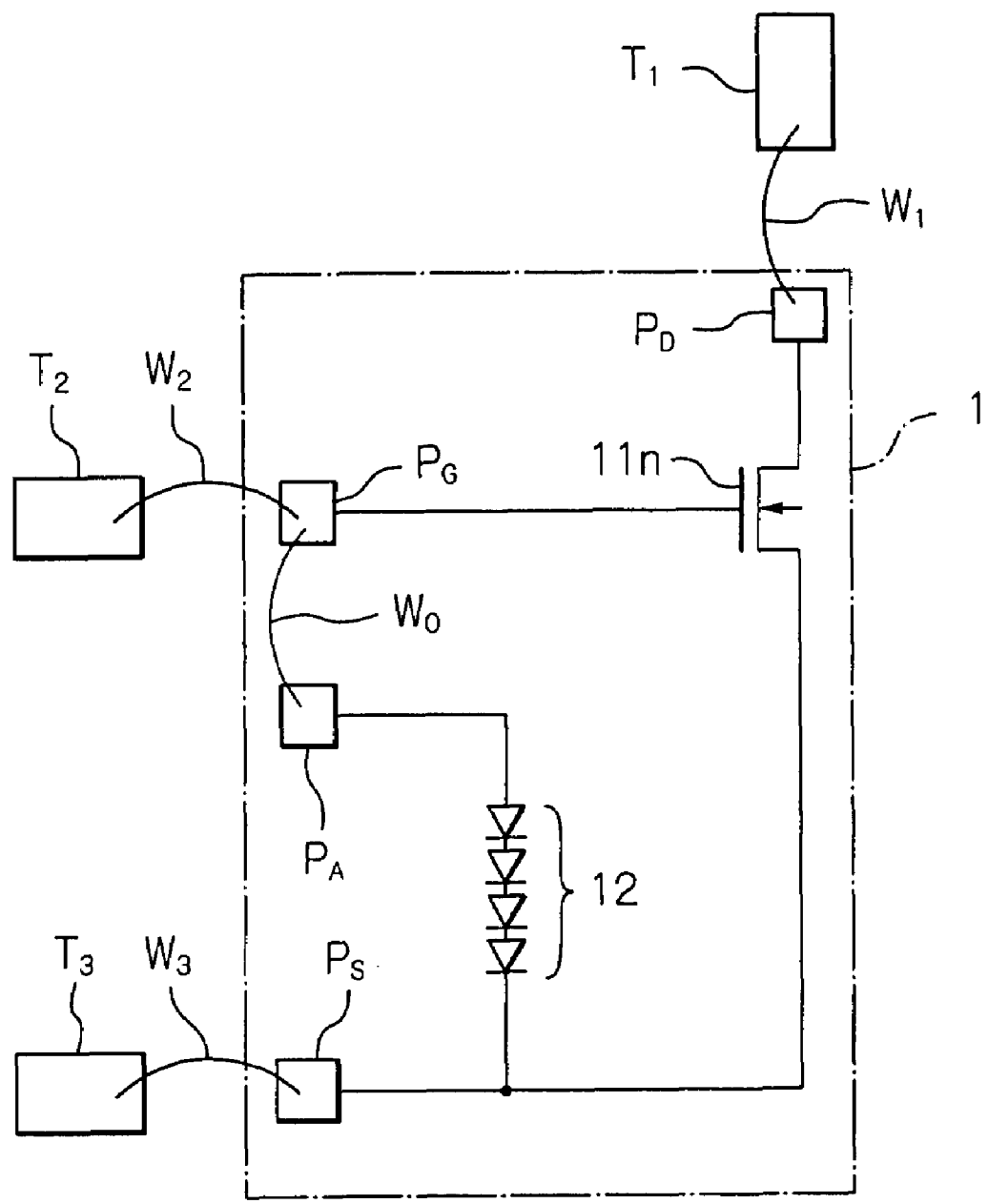
FIG. 1 is a circuit diagram illustrating a prior art semiconductor device.
Figure 2:
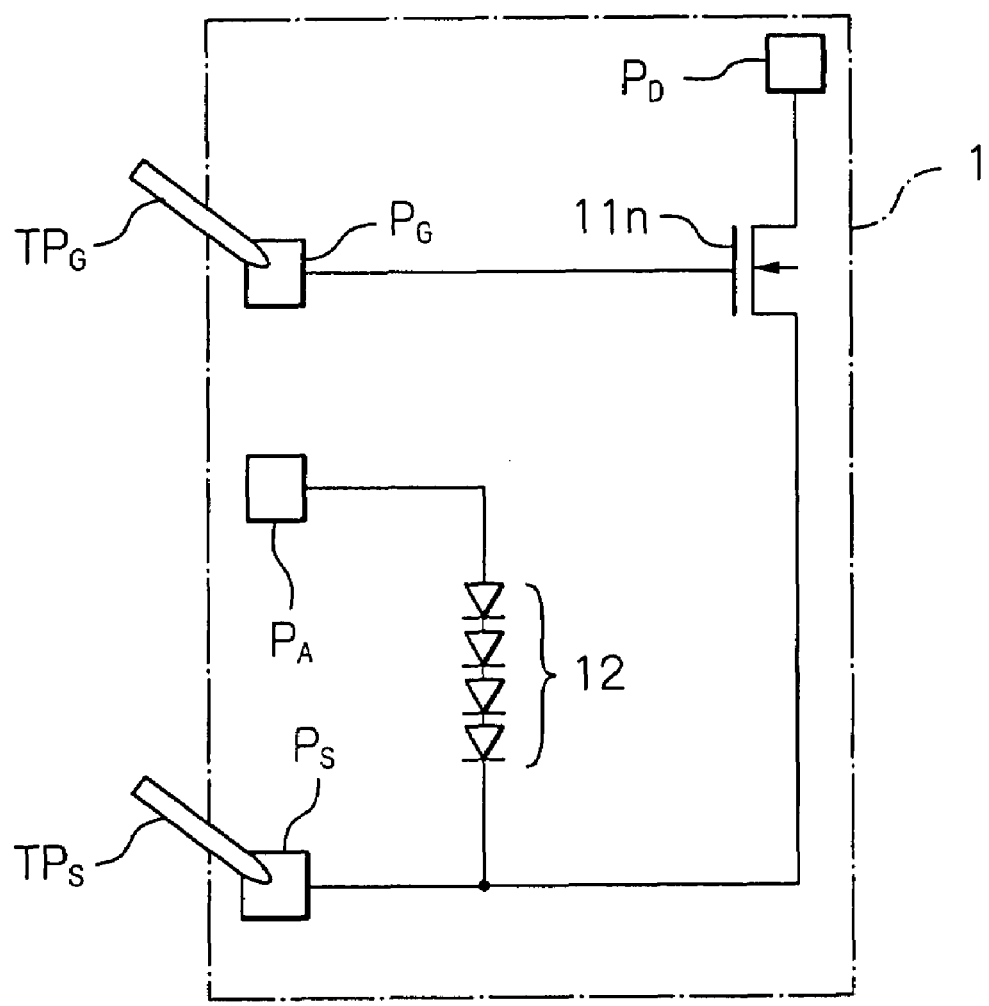
FIG. 2 is a detailed circuit diagram of the semiconductor device of FIG. 1 in a gate breakdown voltage test mode.

Before describing the present invention, the prior art will be explained in detail with reference to FIGS. 1 and 2 in order to facilitate the understanding of the present invention (see: FIGS. 1 and 2 of Japanese Unexamined Patent Publication (Kokai) No. P2005-175054 A).

In FIG. 1, a semiconductor device (chip) 1 is constructed by an n-channel MOS transistor 11n and a protection circuit 12 formed by one diode or two or more serially-connected diodes to clamp the difference in voltage between a gate and source of the n-channel MOS transistor 11n. For example, if the number of diodes in the protection circuit 12 is four, a clamp voltage is four times the forward voltage of one diode.

The n-channel MOS transistor 11n has a drain connected to a drain pad $P_D$. Also, the gate is connected to a gate pad $P_G$, and the source is connected to a source pad $P_S$.

The protection circuit 12 has an anode connected to an anode pad $P_A$ and a cathode connected to the source pad $P_S$.

The semiconductor device 1 is mounted on a board (motherboard or interposer) on which external terminals $T_1$, $T_2$ and $T_3$ are provided.

The anode pad $P_A$ is connected by a bonding wire $W_0$ to the gate pad $P_G$. Also, the drain pad $P_D$, the gate pad $P_G$ and the source pad $P_S$ are connected by bonding wires $W_1$, $W_2$ and $W_3$ to the external terminals $T_1$, $T_2$ and $T_3$, respectively.

Thus, the protection circuit 12 is connected between the gate and source of the n-channel MOS transistor 11n. Therefore, even when an excessive voltage higher than the clamp voltage of the protection circuit 12 is applied between the gate pad $P_G$ and the source pad $P_S$, the protection circuit 12 is in a conductive state, thus preventing the gate insulating layer of the n-channel MOS transistor 11n from being electrostatically destroyed.

A gate breakdown voltage test operation is performed upon the semiconductor device 1 of FIG. 1 which is in a wafer state as illustrated in FIG. 2. In FIG. 2, the bonding wires $W_0$, $W_1$, $W_2$ and $W_3$ of FIG. 1 are not provided, and test probes $TP_G$ and $TP_S$ are in contact with the gate pad $P_G$ and the source pad $P_S$, respectively. Thus, since the protection circuit 12 is not connected to the gate of the n-channel MOS transistor 11n, the protection circuit 12 is invalidated. In this state, a test voltage can be applied between the probes $TP_G$ and $TP_S$ without consideration of the clamp voltage of the protection circuit 12.

After the gate breakdown voltage test operation has been completed, the semiconductor device 1 of FIG. 2 is diced and mounted on a board, and then, a bonding operation is performed thereupon to obtain the semiconductor device 1 of FIG. 1.

In the semiconductor device 1 of FIG. 1, however, since the anode pad $P_A$ whose size is about 100 μm×100 μm, for example, is required, the semiconductor device 1 of FIG. 1 becomes large in size, which would increase the manufacturing cost.

Figure 3:
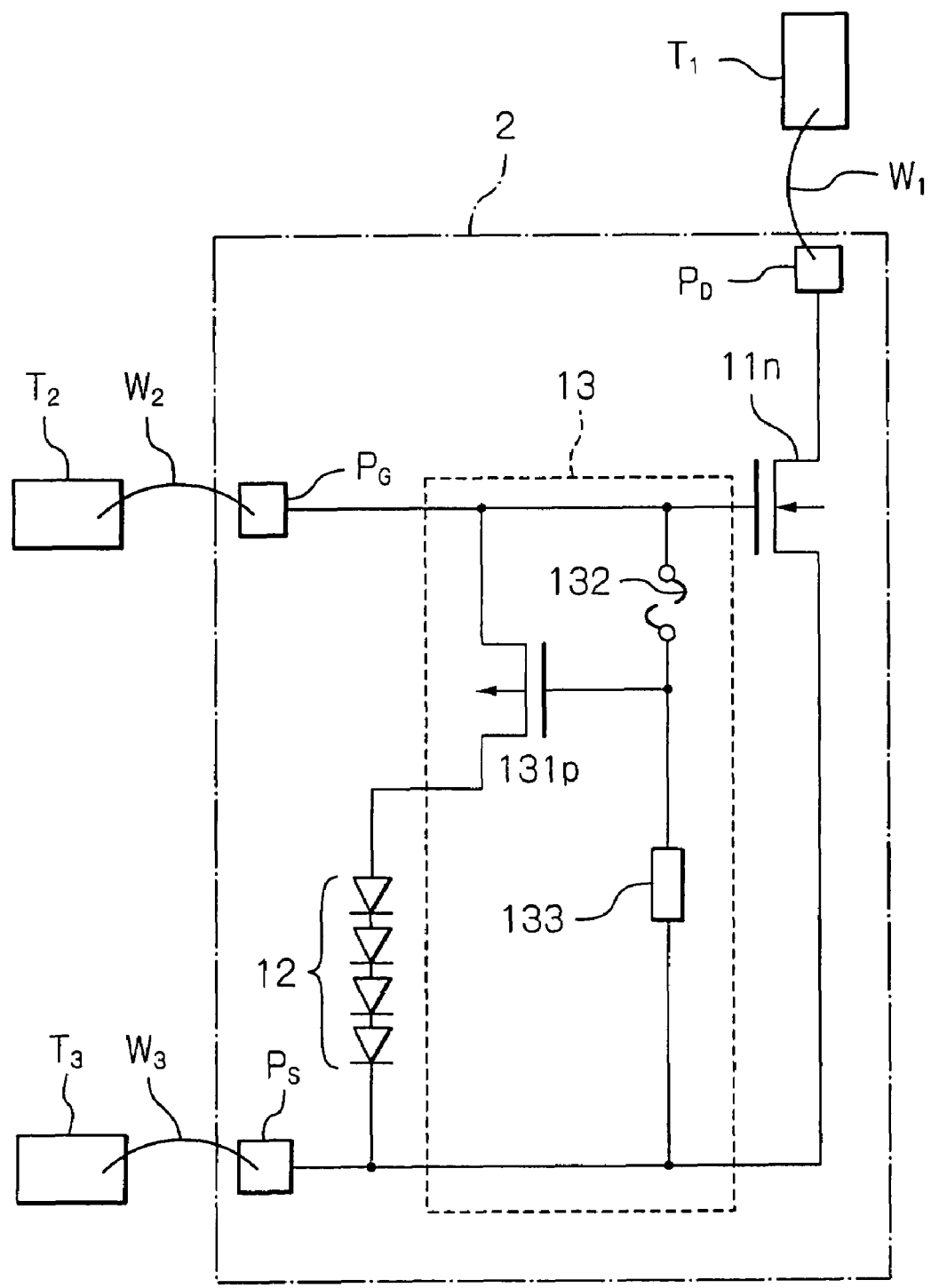
FIG. 3 is a circuit diagram illustrating a first embodiment of the semiconductor device according to the present invention.

In FIG. 3, which illustrates a first embodiment of the semiconductor device according to the present invention, the anode pad $P_A$ and the bonding wire $W_0$ of FIG. 1 are replaced by a switch circuit 13, to form a semiconductor device 2. That is, the switch circuit 13 is connected between the gate of the n-channel MOS transistor 11n and the anode of the protection circuit 12.

The switch circuit 13 is constructed by a p-channel MOS transistor 131p connected between the gate of the n-channel MOS transistor 11n and the anode of the protection circuit 12, a fuse 132 connected between the source and gate of the p-channel MOS transistor 131p, and a resistor 133 serving as a pull-down resistor connected between the gate of the p-channel MOS transistor 131p and the source of the n-channel MOS transistor 11n (the cathode of the protection circuit 12).

In FIG. 3, the fuse 132 is melted. Note that the fuse 132 is a laser-melted fuse which does not require a melting current (voltage) pad.

Thus, even when an excessive voltage higher than the clamp voltage of the protection circuit 12 is applied between the gate pad $P_G$ and the source pad $P_S$, the source-to-gate voltage of the p-channel MOS transistor 131p is increased to turn ON the p-channel MOS transistor 131p, so that the protection circuit 12 is in a conductive state, thus preventing the gate insulating layer of the n-channel MOS transistor 11n from being electrostatically destroyed.

Figure 4:
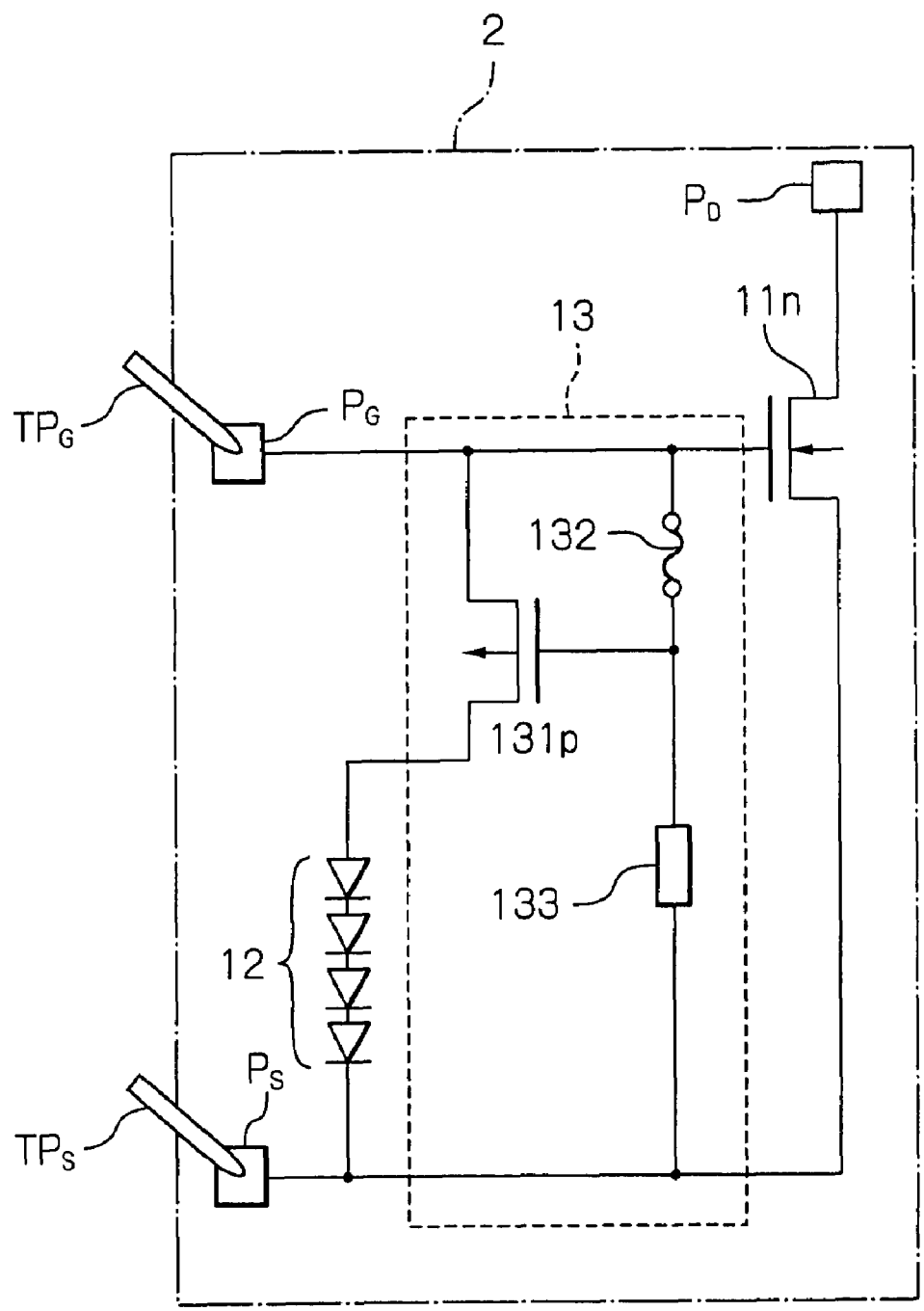
FIG. 4 is a detailed circuit diagram of the semiconductor device of FIG. 3 in a gate breakdown voltage test mode.

A gate breakdown voltage test operation is performed upon the semiconductor device 2 of FIG. 3 which is in a wafer state as illustrated in FIG. 4. In FIG. 4, the bonding wires $W_1$, $W_2$ and $W_3$ of FIG. 3 is not provided and the fuse 132 is not melted. Also, test probes $TP_G$ and $TP_S$ are in contact with the gate pad $P_G$ and the source pad $P_S$, respectively. Thus, since the p-channel MOS transistor 131p is turned OFF, the protection circuit 12 is invalidated. In this state, a test voltage can be applied between the probes $TP_G$ and $TP_S$ without consideration of the clamp voltage of the protection circuit 12.

After the gate breakdown voltage test operation has been completed, the fuse 132 is melted by laser trimming. The semiconductor device 2 of FIG. 4 is diced and mounted on a board, and then, a bonding operation is performed thereupon to obtain the semiconductor device 2 of FIG. 3.

In the semiconductor device 2 of FIG. 3, since the anode pad $P_A$ of FIG. 1 is not required, the semiconductor device 2 of FIG. 3 becomes small in size, which would decrease the manufacturing cost.

Figure 5:
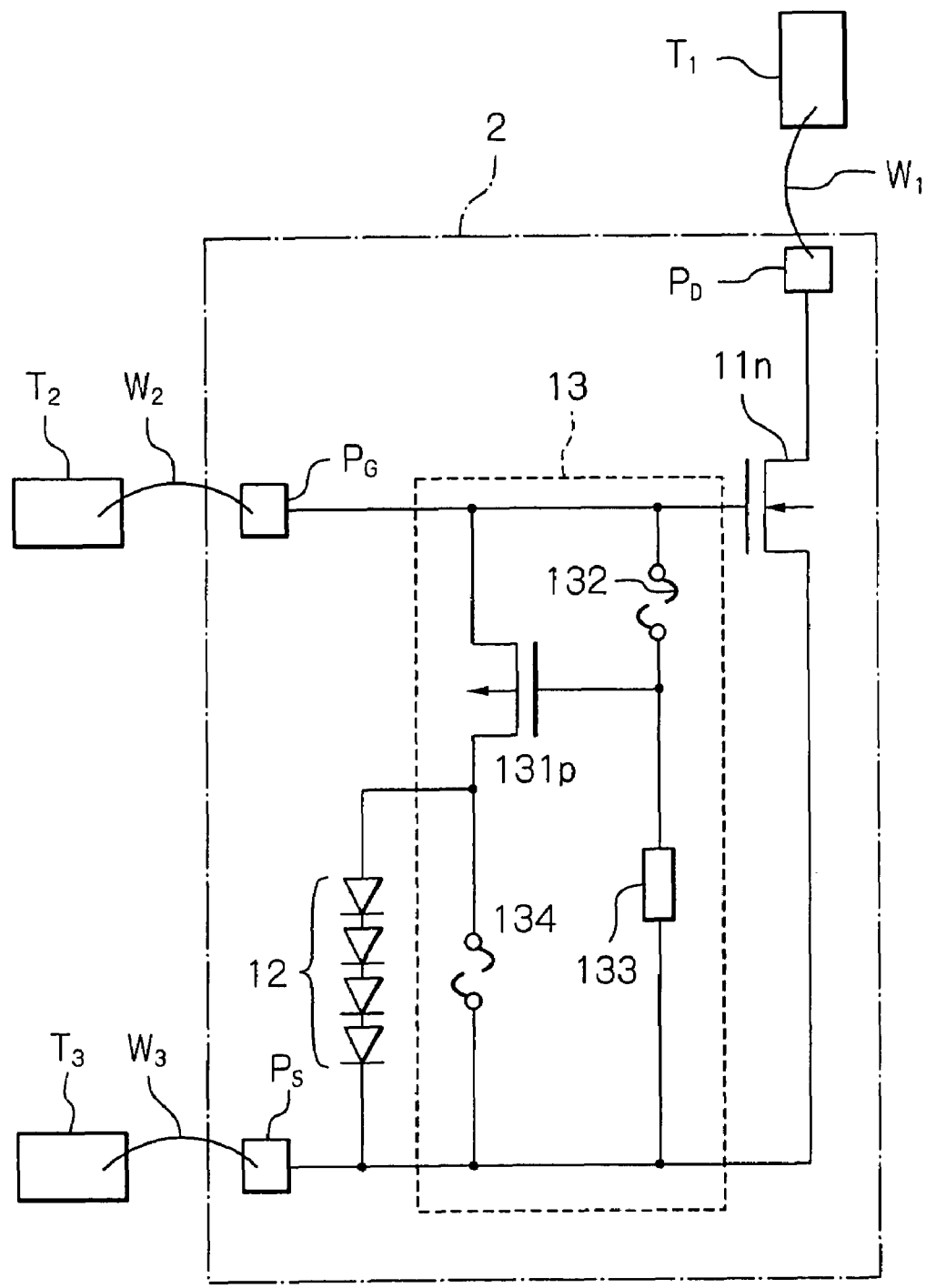
FIG. 5 is a circuit diagram illustrating a modification of the semiconductor device of FIG. 3.

In FIG. 5, which illustrates a modification of the semiconductor device 2 of FIG. 3, a fuse 134 is added to the switch circuit 13 of FIG. 3. The fuse 134 is connected in parallel with the protection circuit 12.

Even in FIG. 5, the fuse 134 is melted. Note that the fuse 134 is also a laser-melted fuse which does not require a melting current (voltage) pad.

Figure 6:
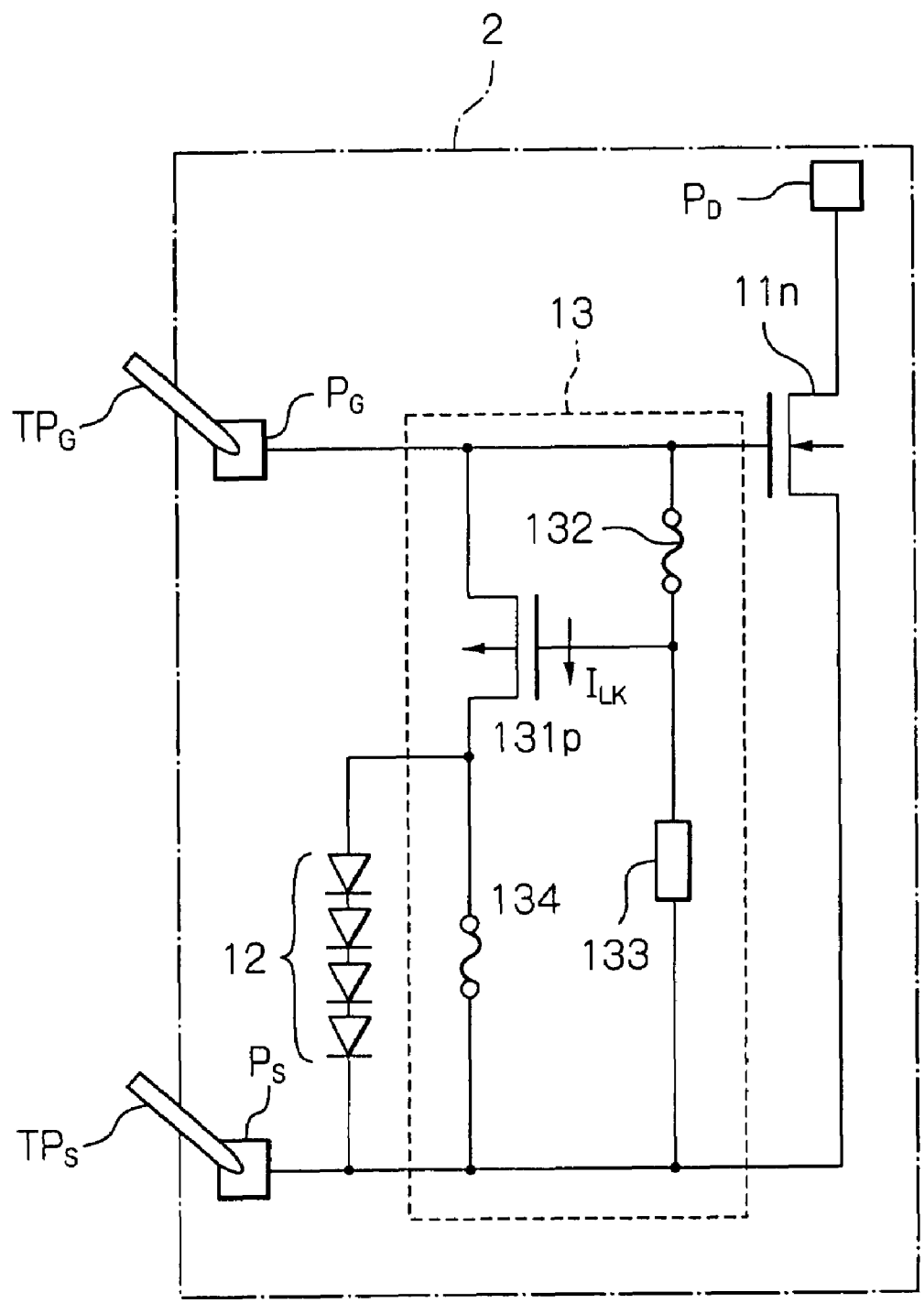
FIG. 6 is a detailed circuit diagram of the semiconductor device of FIG. 5 in a gate breakdown voltage test mode.

A gate breakdown voltage test operation is performed upon the semiconductor device 2 of FIG. 5 which is in a wafer state as illustrated in FIG. 6. In FIG. 6, the bonding wires $W_1$, $W_2$ and $W_3$ of FIG. 5 are not provided and the fuses 132 and 134 are not melted. Also, test probes $TP_G$ and $TP_S$ are in contact with the gate pad $P_G$ and the source pad P $P_S$, respectively. Thus, since the p-channel MOS transistor 131p is turned OFF, the protection circuit 12 is invalidated. In this state, a test voltage is applied so that a leakage current $I_{LK}$ may flow through the p-channel MOS transistor 131p as indicated in FIG. 6. Even in this case, the leakage current $I_{LK}$ flows through the fuse 134, not the protection circuit 12. As a result, such a test voltage can be applied between the probes $TP_G$ and $TP_S$ without consideration of the clamp voltage of the protection circuit 12.

After the gate breakdown voltage test operation, the fuse 134 together with the fuse 132 is trimmed by laser.

Figure 7:
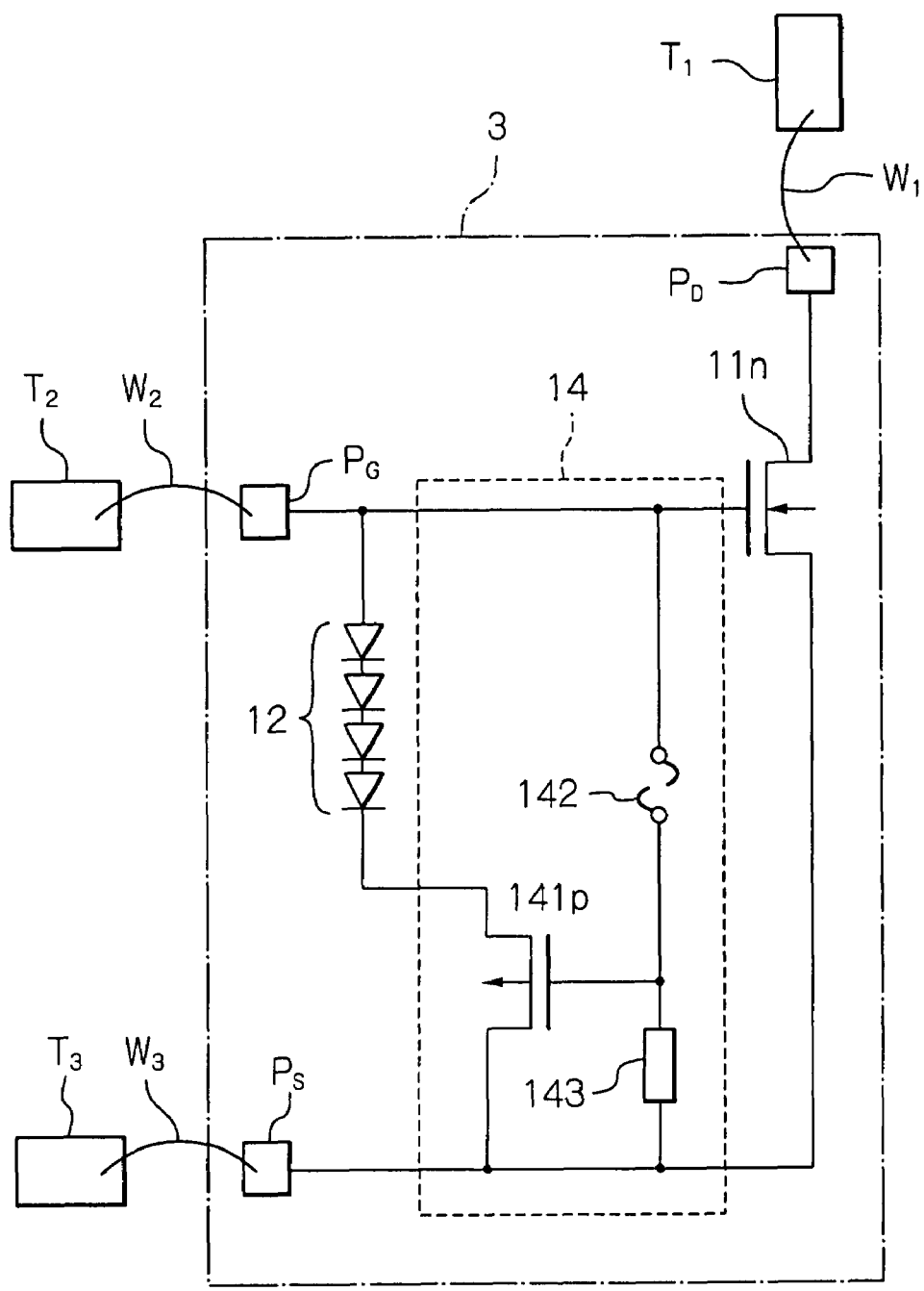
FIG. 7 is a circuit diagram illustrating a second embodiment of the semiconductor device according to the present invention.

In FIG. 7, which illustrates a second embodiment of the semiconductor device according to the present invention, the anode of the protection circuit 12 of FIG. 3 is connected to the gate of the n-channel MOS transistor 11n, and the switch circuit 13 of FIG. 3 is replaced by a switch circuit 14, to form a semiconductor device 3. That is, the switch circuit 14 is connected between the cathode of the protection circuit 12 and the source of the n-channel MOS transistor 11n.

The switch circuit 14 is constructed by a p-channel MOS transistor 141p connected between the cathode of the protection circuit 12 and the source of the n-channel MOS transistor 11n, a fuse 142 connected between the anode of the protection circuit 12 and the gate of the p-channel MOS transistor 141p, and a resistor 143 serving as a pull-down resistor connected between the gate and drain of the p-channel MOS transistor 141p.

In FIG. 7, the fuse 142 is melted. Note that the fuse 142 is a laser-melted fuse which does not require a melting current (voltage) pad.

Thus, even when an excessive voltage higher than the clamp voltage of the protection circuit 12 is applied between the gate pad $P_G$ and the source pad $P_S$, the source-to-gate voltage of the p-channel MOS transistor 141p is increased to turn ON the p-channel MOS transistor 141p, so that the protection circuit 12 is in a conductive state, thus preventing the gate insulating layer of the n-channel MOS transistor 11n from being electrostatically destroyed.

Figure 8:
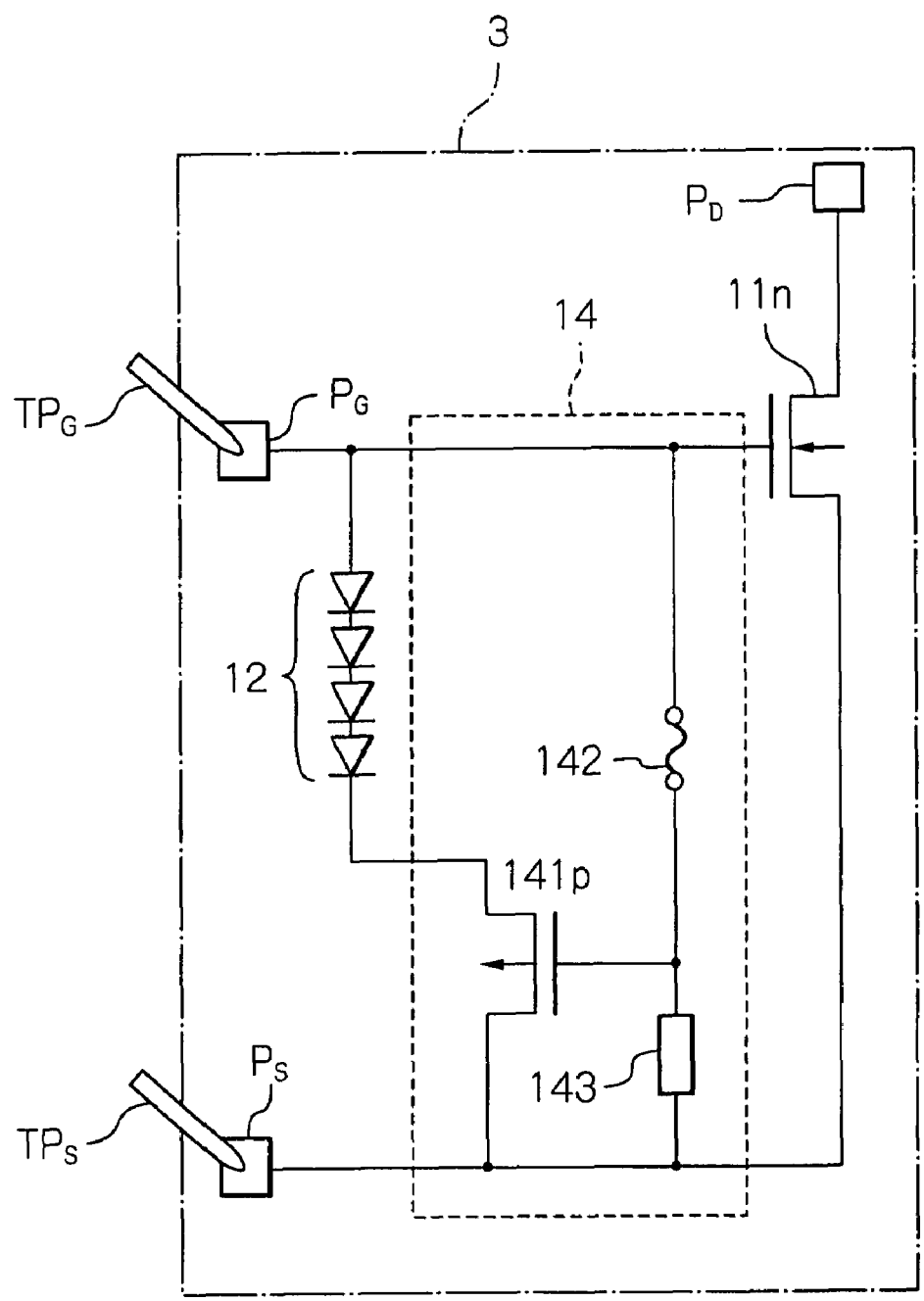
FIG. 8 is a detailed circuit diagram of the semiconductor device of FIG. 7 in a gate breakdown voltage test mode.

A gate breakdown voltage test operation is performed upon the semiconductor device 3 of FIG. 7 which is in a wafer state as illustrated in FIG. 8. In FIG. 8, the bonding wires $W_1$, $W_2$ and $W_3$ of FIG. 7 are not provided and the fuse 142 is not melted. Also, test probes $TP_G$ and $TP_S$ are in contact with the gate pad $P_G$ and the source pad $P_S$, respectively. Thus, since the p-channel MOS transistor 141p is turned OFF, the protection circuit 12 is invalidated. In this state, a test voltage can be applied between the probes $TP_G$ and $TP_S$ without consideration of the clamp voltage of the protection circuit 12.

After the gate breakdown voltage test operation has been completed, the fuse 142 is melted by laser trimming. The semiconductor device 3 of FIG. 8 is diced and mounted on a board, and then, a bonding operation is performed thereupon to obtain the semiconductor device 3 of FIG. 7.

In the semiconductor device 3 of FIG. 7, since the anode pad $P_A$ of FIG. 1 is not required, the semiconductor device 3 of FIG. 7 becomes small in size, which would decrease the manufacturing cost.

Figure 9:
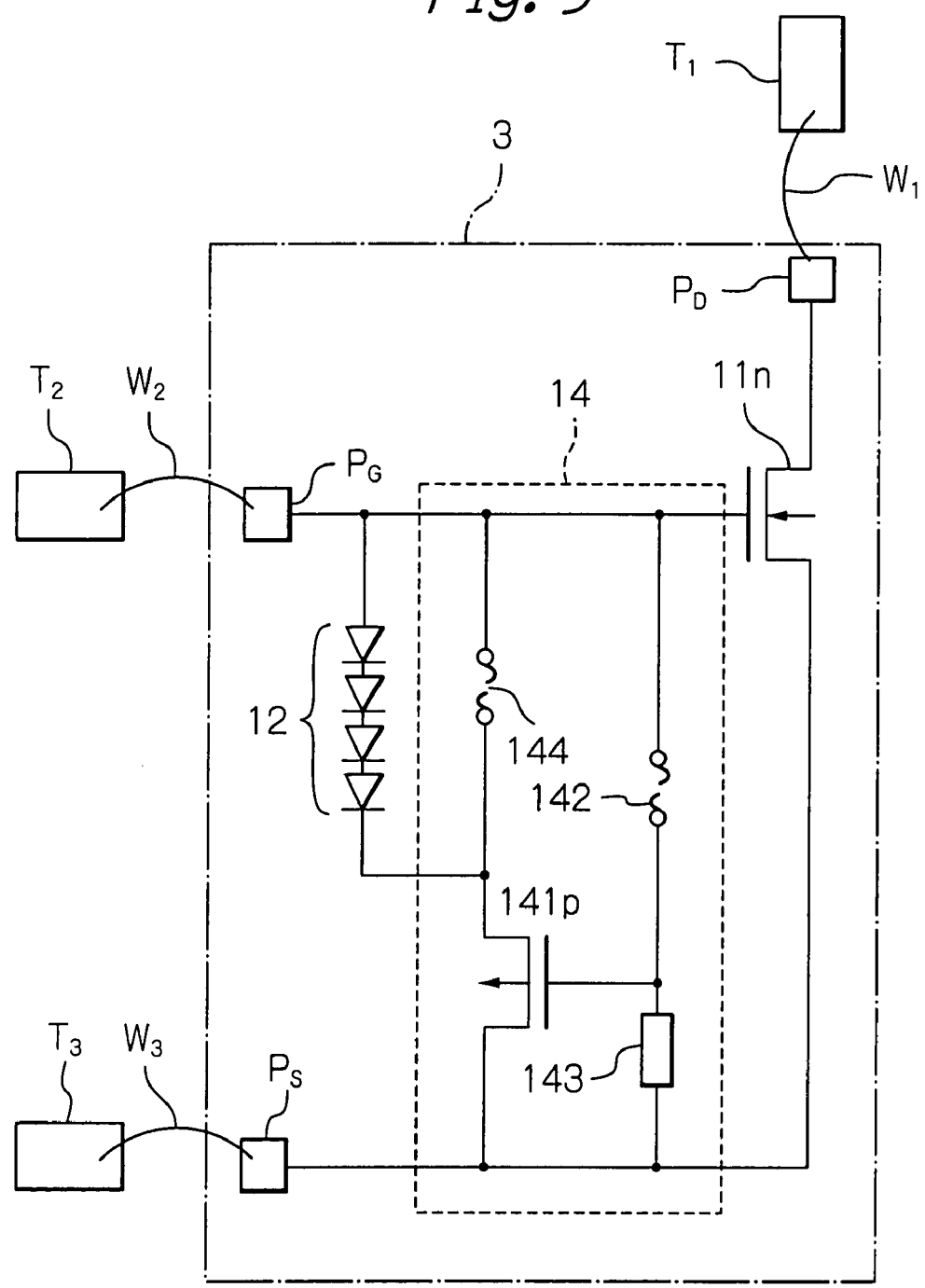
FIG. 9 is a circuit diagram illustrating a modification of the semiconductor device of FIG. 7.

In FIG. 9, which illustrates a modification of the semiconductor device 3 of FIG. 7, a fuse 144 is added to the switch circuit 14 of FIG. 7. The fuse 144 is connected in parallel with the protection circuit 12.

Even in FIG. 9, the fuse 144 is melted. Note that the fuse 144 is also a laser-melted fuse which does not require a melting current (voltage) pad.

Figure 10:
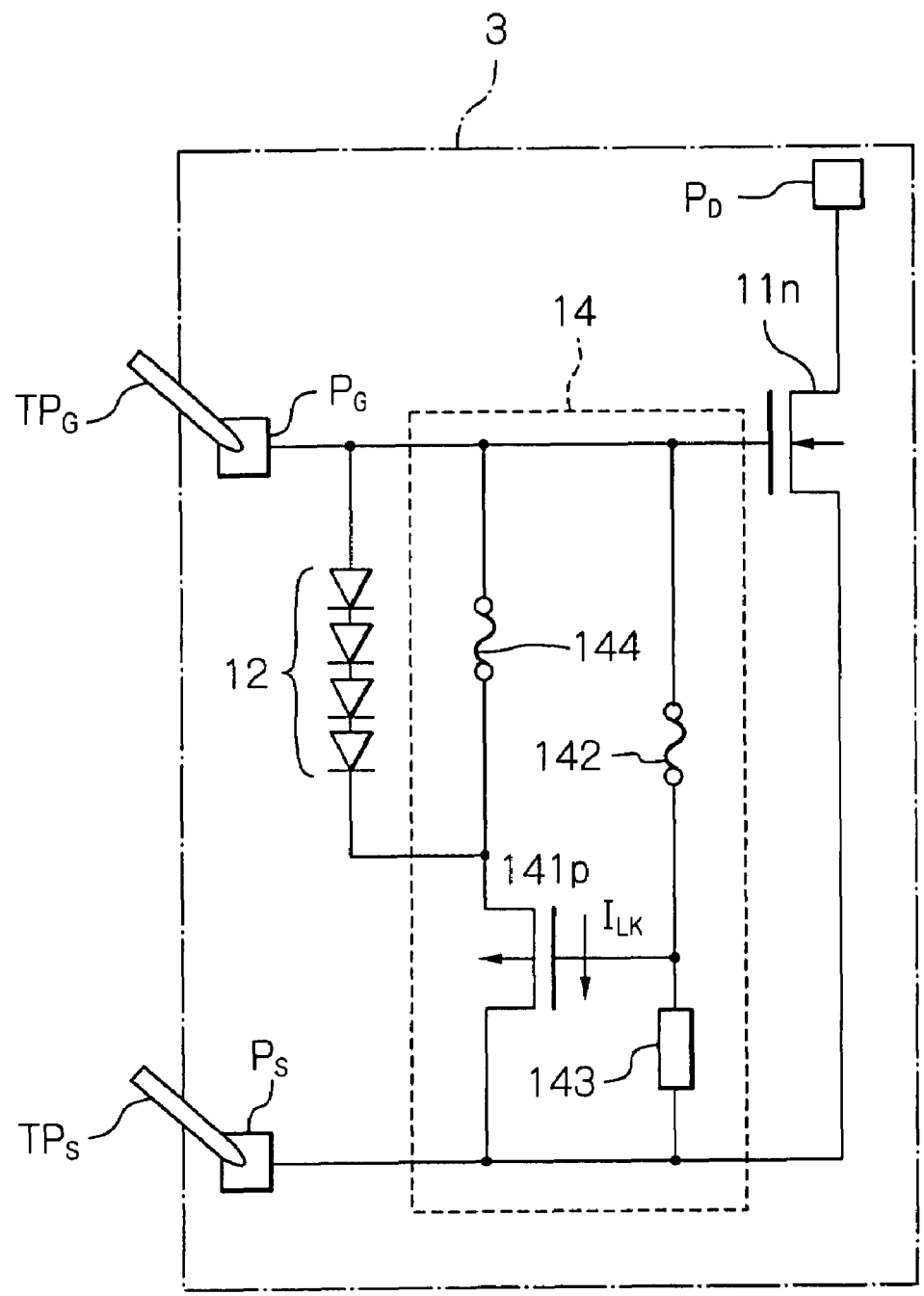
FIG. 10 is a detailed circuit diagram of the semiconductor device of FIG. 9 in a gate breakdown voltage test mode.

A gate breakdown voltage test operation is performed upon the semiconductor device 3 of FIG. 9 which is in a wafer state as illustrated in FIG. 10. In FIG. 10, the bonding wires $W_1$, $W_2$ and $W_3$ of FIG. 9 are not provided and the fuses 142 and 144 are not melted. Also, test probes $TP_G$ and $TP_S$ are in contact with the gate pad $P_G$ and the source pad $P_S$, respectively. Thus, since the p-channel MOS transistor 141p is turned OFF, the protection circuit 12 is invalidated. In this state, a test voltage is applied so that a leakage current $I_{LK}$ may flow through the p-channel MOS transistor 141p as indicated in FIG. 10. Even in this case, the leakage current $I_{LK}$ flows through the fuse 144, not the protection circuit 12. As a result, such a test voltage can be applied between the probes $TP_G$ and $TP_S$ without consideration of the clamp voltage of the protection circuit 12.

After the gate breakdown voltage test operation, the fuse 144 together with the fuse 142 is trimmed by laser.

In the semiconductor devices 2 and 3 of FIGS. 3 to 10, the size of the switch circuits 13 and 14 is smaller than that of the anode pad $P_A$ of FIG. 1. For example, the size of the p-channel MOS transistor 131p (141p) is about 5 μm×50 μm (=250 μm$^2$) and the size of the resistor 133 (143) is about 1 μm×5 μm (=5 μm$^2$). Also, since connections serve as the fuses 132 and 134 (142 and 144), the size of the fuses 132 and 134 (142 and 144) is trivial. Therefore, the size of the switch circuit 13 (14) is about 300 μm$^2$, while the size of the anode pad $P_A$ of FIG. 1 is 10000 μm$^2$. Thus, the size of the semiconductor devices 2 and 3 of FIGS. 3 to 10 is much smaller than that of the semiconductor device 1 of FIGS. 1 and 2.

Figure 11A:
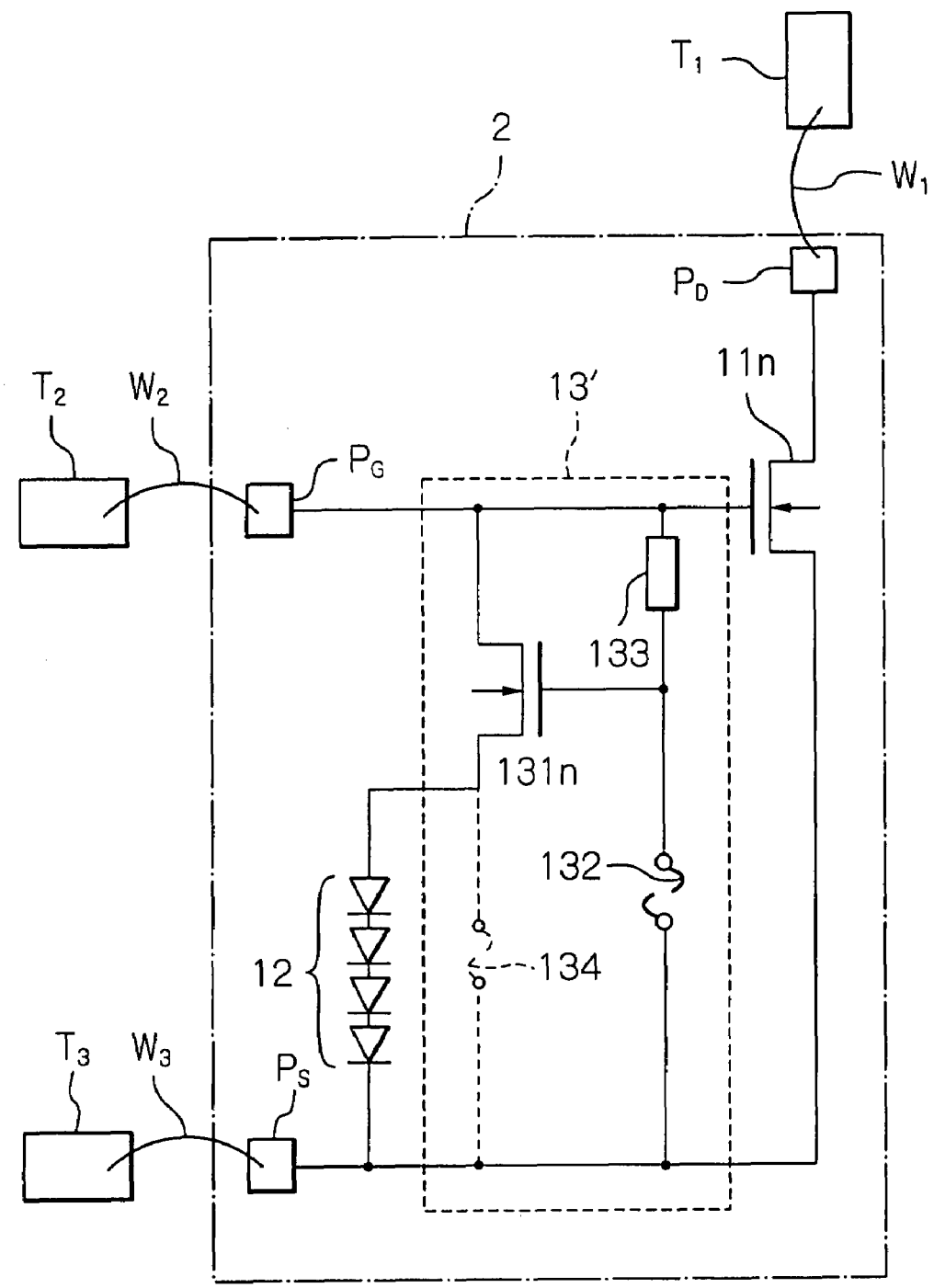
FIGS. 11A and 11B are circuit diagrams illustrating other modifications of the semiconductor devices of FIGS. 3 and 7, respectively.
Figure 11B:
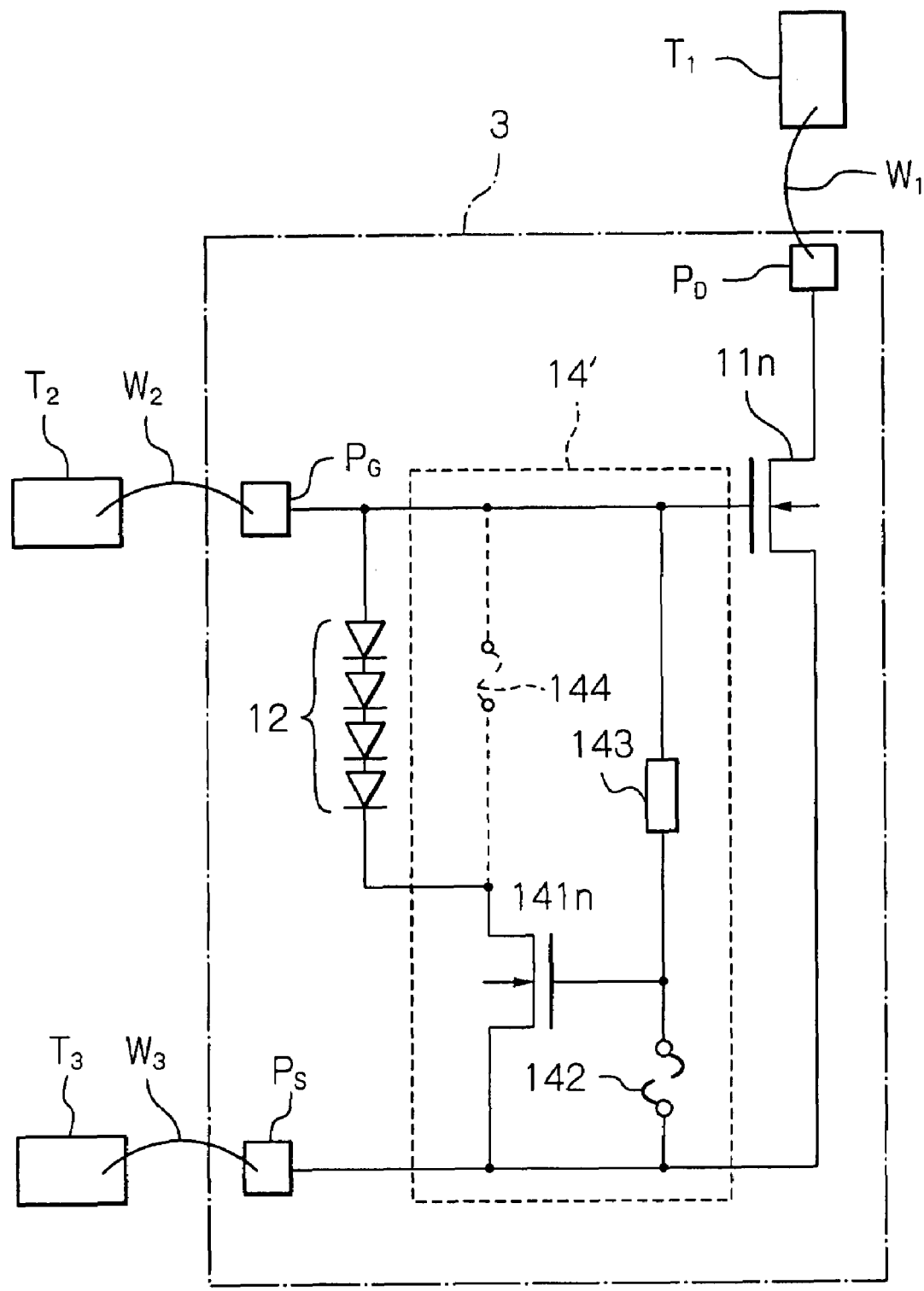

In the semiconductor devices 2 and 3 of FIGS. 3 to 10, the transistor 11n is of an n-type and the transistors 131p and 141p are of a p-type. The transistors 131p and 141p can be replaced by n-channel MOS transistors 131n and 141n, respectively, as illustrated in FIGS. 11A and 11B corresponding to FIGS. 3 and 7, respectively. In FIGS. 11A and 11B, the switch circuits 13 and 14 of FIGS. 3 and 7 are replaced by switch circuits 13' and 14', respectively, where the transistor 131n (141n) is provided instead of the transistor 131p (141p), and the fuse 132 (142) and the resistor 133 (143) are exchanged with each other.

In FIGS. 11A and 11B, note that fuses 134 and 144 can be added to the switch circuits 13' and 14', respectively.

Figure 12A:
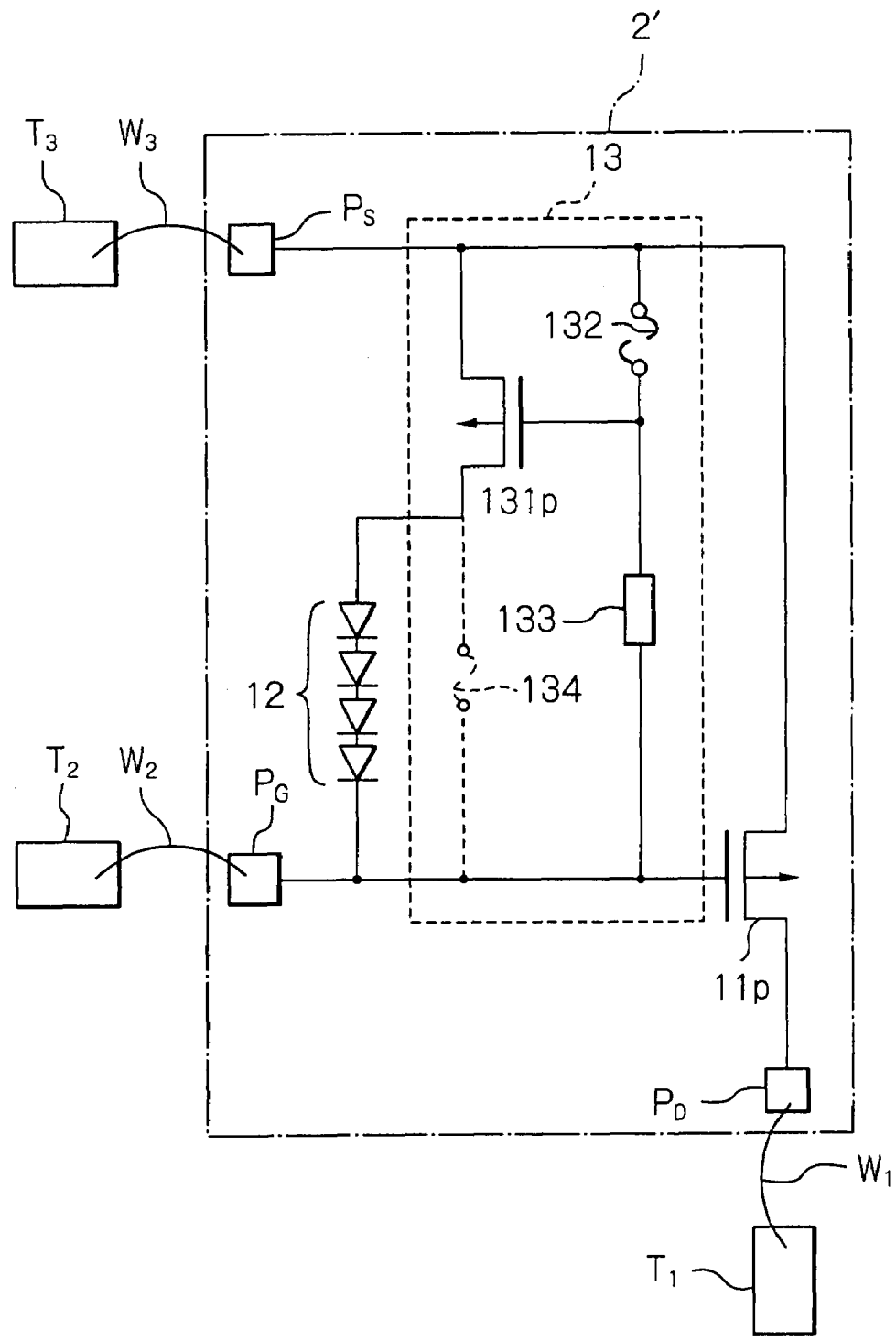
FIGS. 12A and 12B are circuit diagrams further illustrating other modifications of the semiconductor devices of FIGS. 3 and 7, respectively.
Figure 12B:
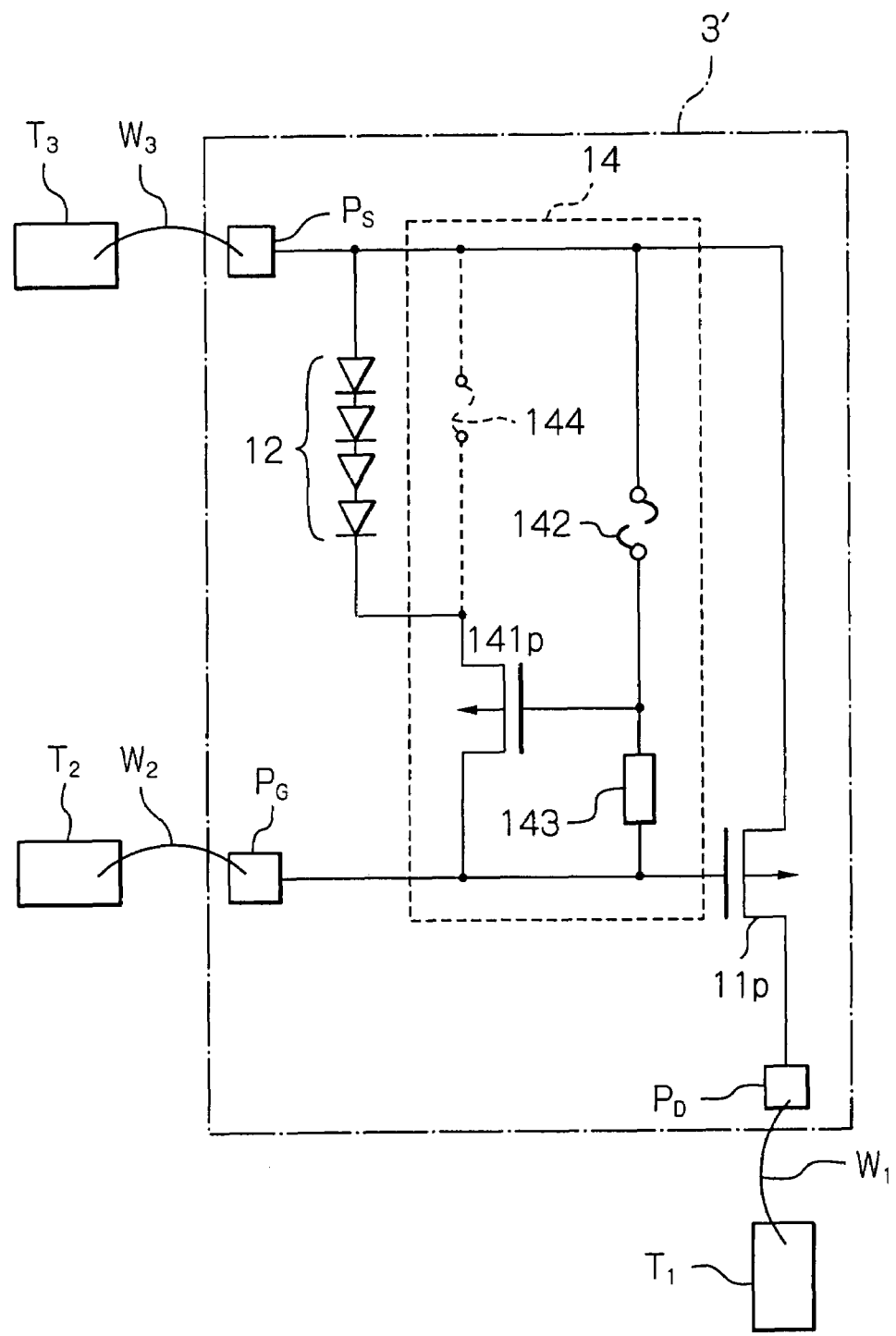

Also, the transistor 11n can be replaced by a p-channel MOS transistor 11p as illustrated in FIGS. 12A and 12B corresponding to FIGS. 3 and 7, respectively. In FIGS. 12A and 12B, the semiconductor devices 2 and 3 of FIGS. 3 and 7 are replaced by semiconductor devices 2' and 3', respectively, where the transistor 11p is provided instead of the transistor 11n of FIGS. 3 and 7.

In FIGS. 12A and 12B, note that fuses 134 and 144 can be added to the switch circuits 13 and 14, respectively.

Figure 13A:
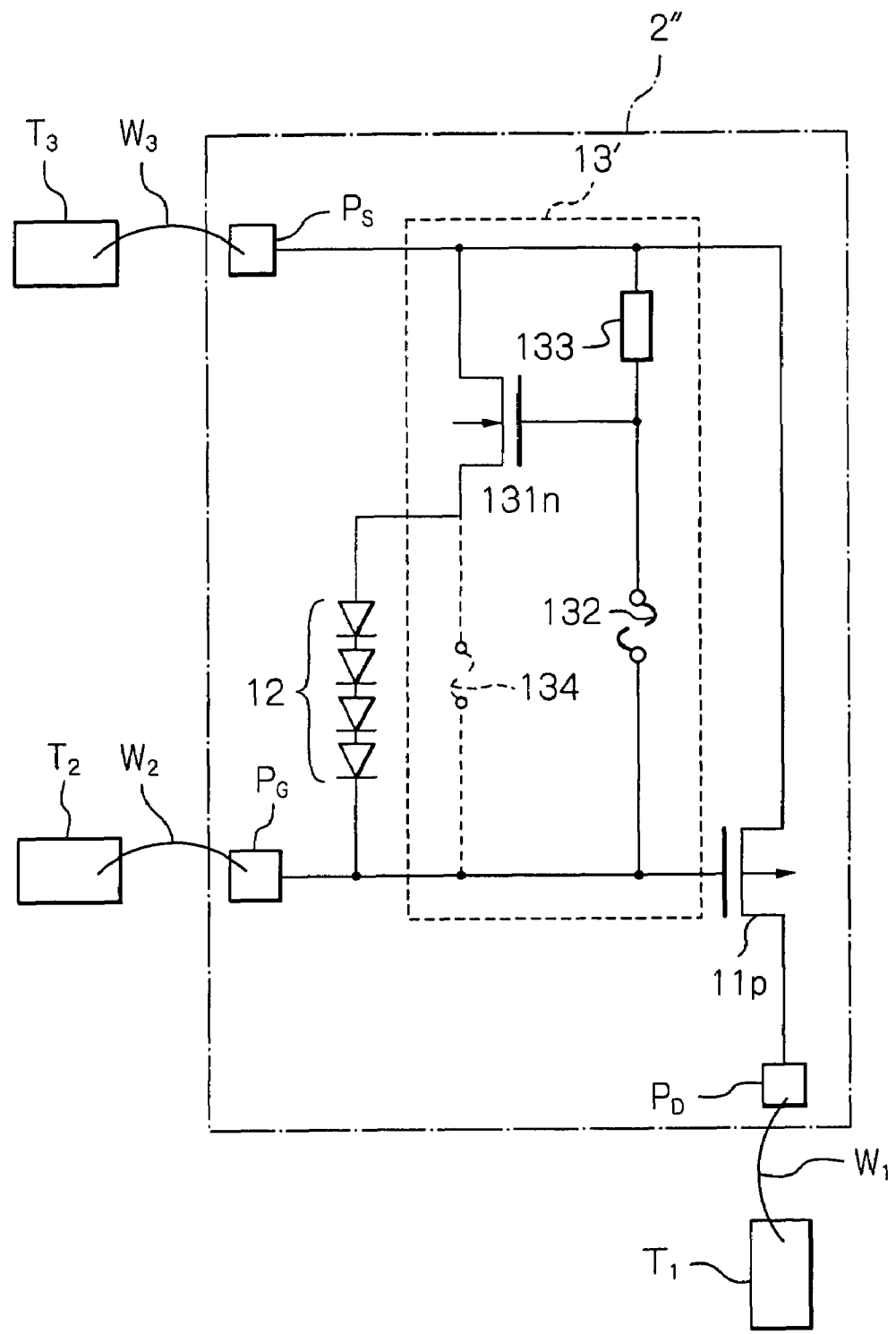
FIGS. 13A and 13B are circuit diagrams further illustrating still other modifications of the semiconductor devices of FIGS. 3 and 7, respectively.
Figure 13B:
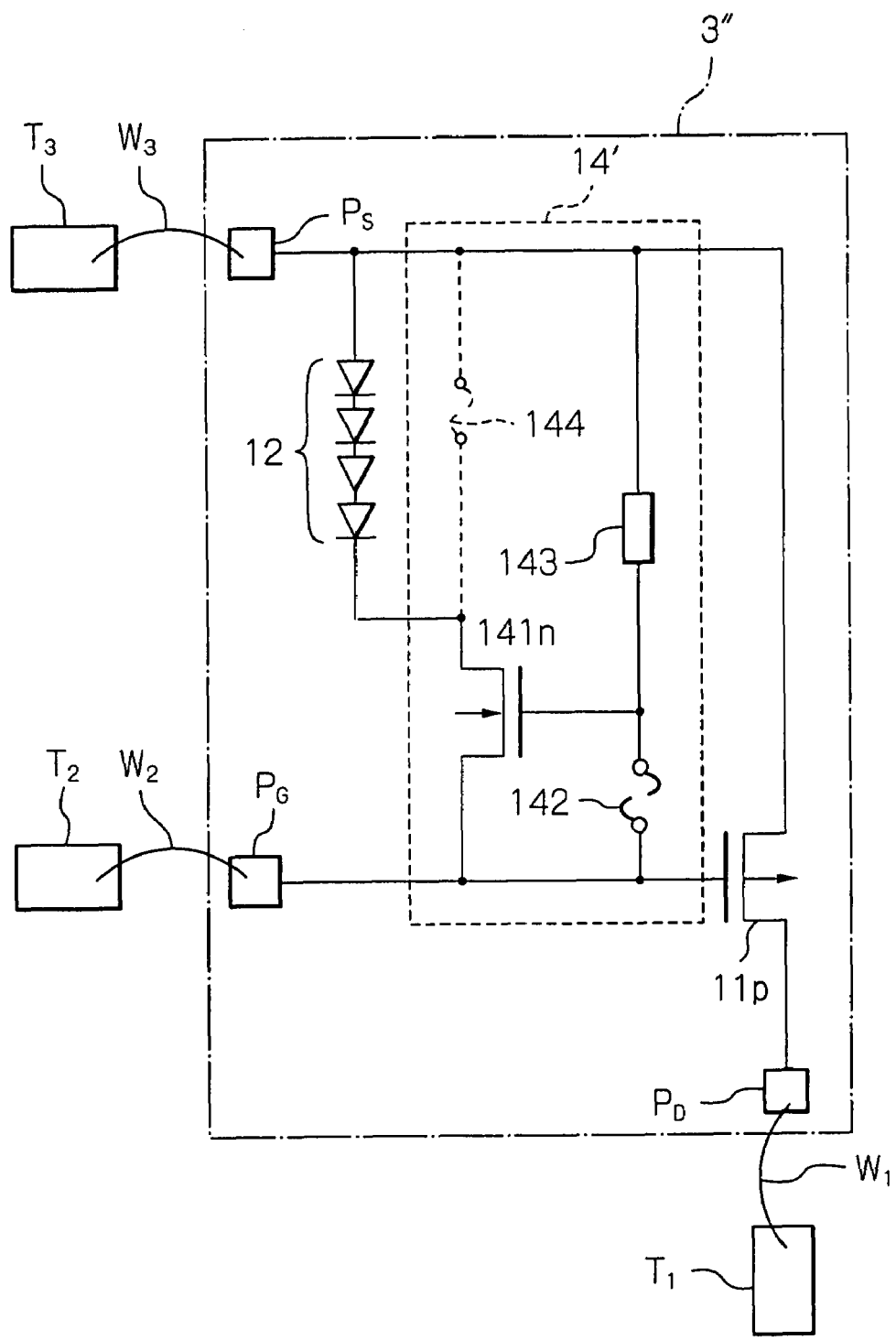

Further, the transistors 131p and 141p can be replaced by n-channel MOS transistors 131n and 141n, respectively, and also, the transistor 11n can be replaced by a p-channel MOS transistor 11p, as illustrated in FIGS. 13A and 13B corresponding to FIGS. 3 and 7, respectively. In FIGS. 13A and 13B, the semiconductor devices 2 and 3 of FIGS. 3 and 7 are replaced by semiconductor devices 2" and 3", respectively, where the transistor 11p is provided instead of the transistor 11n of FIGS. 3 and 7, and the switch circuits 13 and 14 of FIGS. 3 and 7 are replaced by switch circuits 13' and 14', respectively, where the transistor 131n (141n) is provided instead of the transistor 131p (141p), and the fuse 132 (142) and the resistor 133 (143) are changed with each other.

In FIGS. 13A and 13B, note that fuses 134 and 144 can be added to the switch circuits 13' and 14', respectively.

Figure 14A:
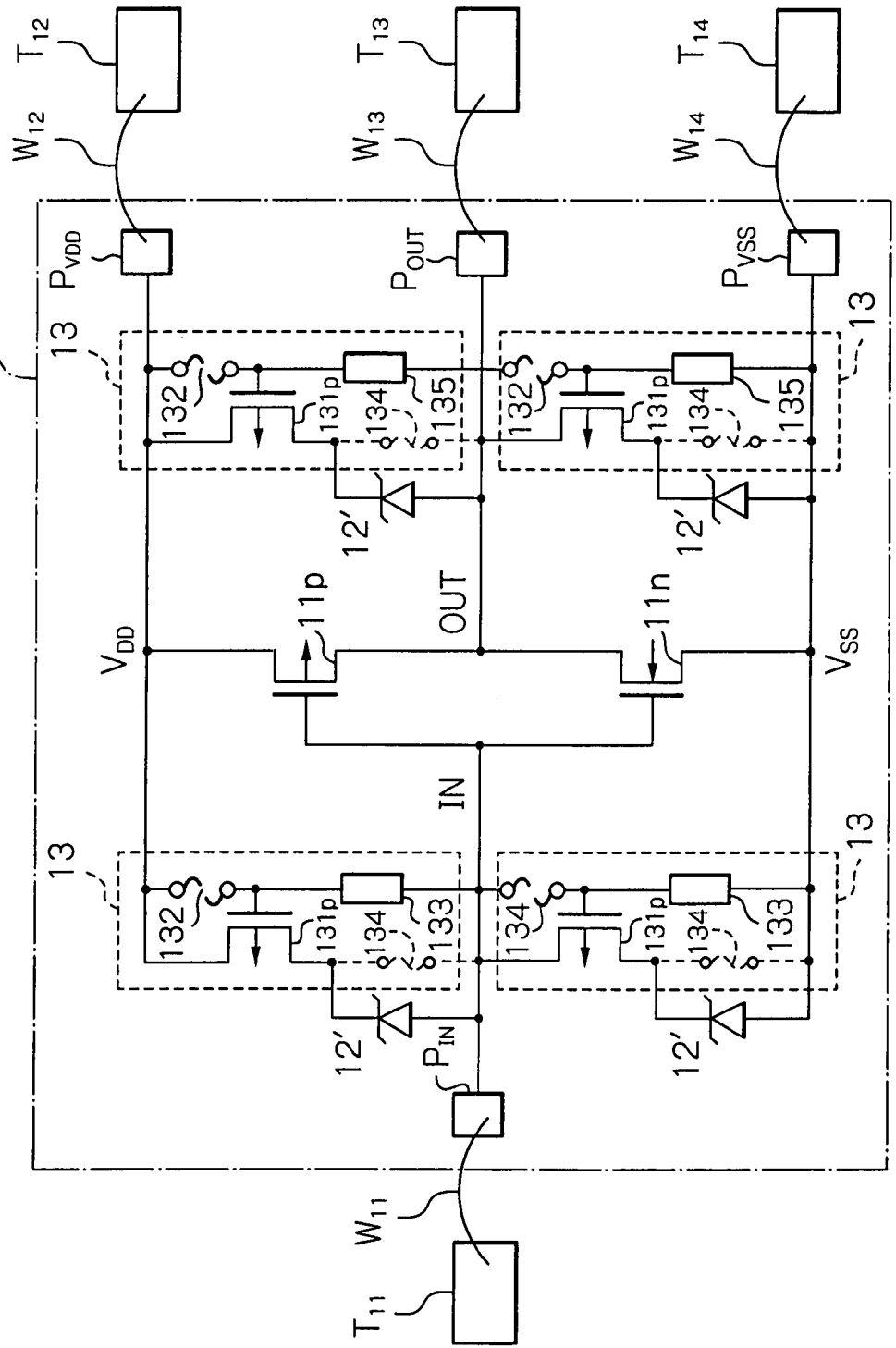
FIGS. 14A and 14B are circuit diagrams illustrating third and fourth embodiments of the semiconductor device according to the present invention.
Figure 14B:
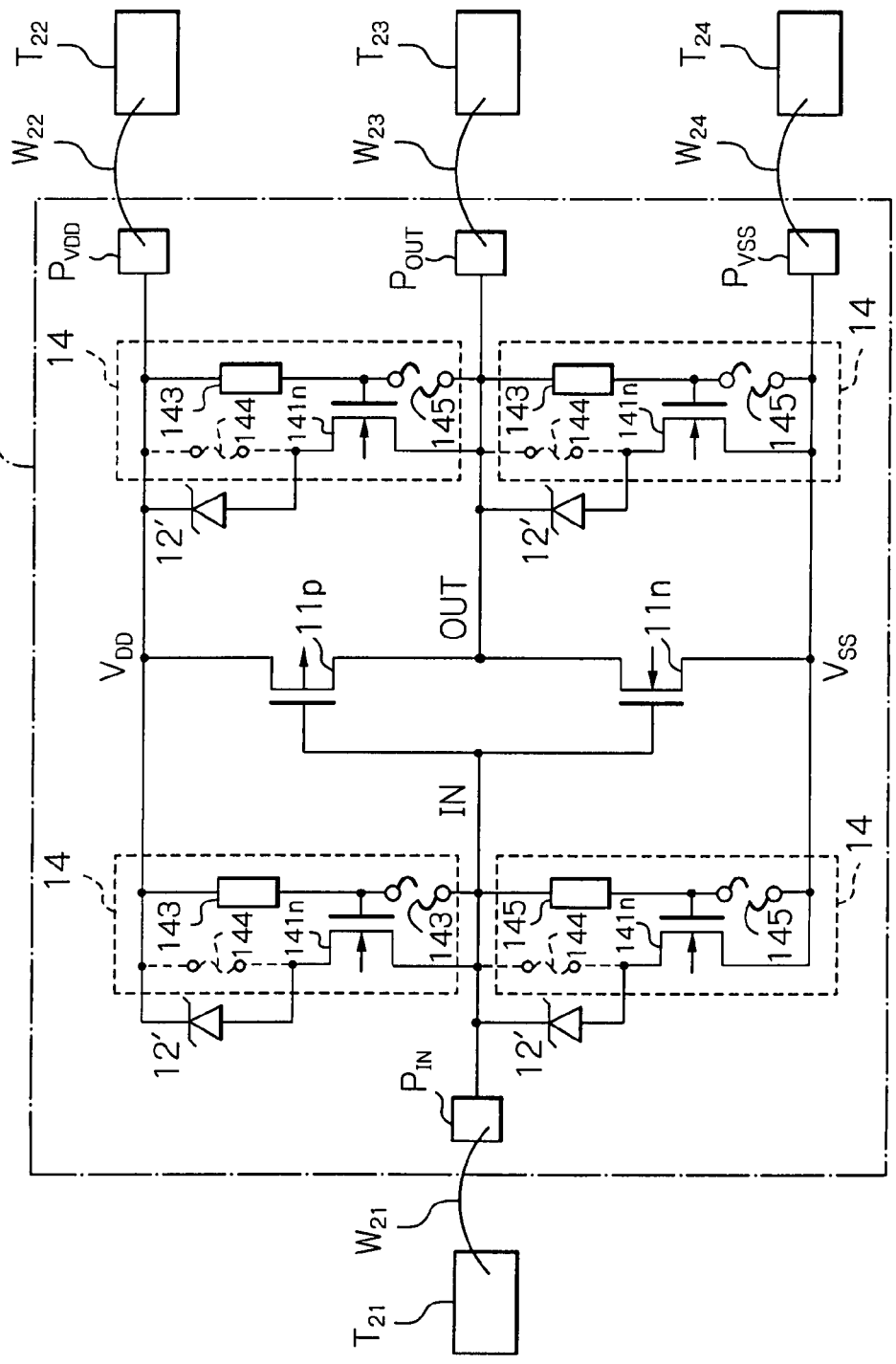

Additionally, the protection circuit 12 can be constructed by a Zener diode whose breakdown voltage serves as a clamp voltage (see: FIGS. 14A and 14B).

FIGS. 14A and 14B illustrate third and fourth embodiments, respectively, of the semiconductor device according to the present invention. That is, the switch circuits 13 (13') and 14 (14') of FIGS. 3 and 7 (FIGS. 11A and 11B) can be applied to a CMOS device as illustrated in FIGS. 14A and 14B, where the p-channel MOS transistor 11p and the n-channel MOS transistor 11n are connected in series between power supply lines $V_{DD}$ and $V_{SS}$. The gates of the transistors 11p and 11n are connected to an input line IN and the drains of the transistors 11p and 11n are connected to an output line OUT.

In FIGS. 14A and 14B, the switch circuits 13 and 14 are connected between the source and drain of the p-channel MOS transistor 11p and between the source and drain of the n-channel MOS transistor 11n.

In FIG. 14A, Zener diodes 12' serving as protection circuits 12 of FIG. 3 are connected between the power supply line $V_{DD}$ and the input line IN, between the input line IN and the power supply line $V_{SS}$, between the power supply line $V_{DD}$ and the output line OUT, and between the output line OUT and the power supply line $V_{SS}$. Switch circuits which are the same as the switch circuit 13 of FIG. 3 are connected to the cathodes of the Zener diodes 12', the power supply line $V_{DD}$ (or the power supply line $V_{SS}$) and the input line IN (or the output line OUT). Also, an input pad $P_{IN}$, a power supply pad $P_{VDD}$, output pad $P_{OUT}$ and a power supply pad $P_{VSS}$ are connected by bonding wires $W_{11}$, $W_{12}$, $W_{13}$ and $W_{14}$ to external terminals $T_{11}$, $T_{12}$, $T_{13}$ and $T_{14}$, respectively. Thus, a semiconductor device 4 is formed.

In FIG. 14B, Zener diodes 12' serving as protection circuits 12 of FIG. 7 are also connected between the power supply line $V_{DD}$ and the input line IN, between the input line IN and the power supply line $V_{SS}$, between the power supply line $V_{DD}$ and the output line OUT, and between the output line OUT and the power supply line $V_{SS}$. Switch circuits which are the same as the switch circuit 14 of FIG. 7 are connected to the anodes of the Zener diodes 12' and the power supply line $V_{DD}$ (or the power supply line $V_{SS}$) and the input line IN (or the output line OUT). Also, an input pad $P_{IN}$, a power supply pad $P_{VDD}$, and output pad $P_{OUT}$ and a power supply pad $P_{VSS}$ are connected by bonding wires $W_{21}$, $W_{22}$, $W_{23}$ and $W_{24}$ to external terminals $T_{21}$, $T_{22}$, $T_{23}$ and $T_{24}$, respectively. Thus, a semiconductor device 5 is formed.

In FIGS. 14A and 14B, when a gate breakdown voltage test operation is performed upon the semiconductor devices 4 and 5 in a wafer state where the fuses 132 and 142 are not melted, test probes (not shown) are in contact with the input pad $P_{IN}$, the power supply pad $P_{VDD}$ and the power supply pad $P_{VSS}$) respectively. In this case, the transistor 131p or 131n is turned OFF so that the Zener diodes 12' are invalidated. Therefore, a test voltage can be applied the pad $P_{IN}$ to observe the breakdown voltage of the p-channel MOS transistor 11p and the breakdown voltage of the n-channel MOS transistor 11n. In this case, the test voltage needs to be increased or decreased within a large voltage range from 0V to 30V, for example.

That is, voltages of 30V and 0V are applied to the pads $P_{VDD}$ and $P_{VSS}$, respectively, while the switch circuits 13 and 14 are turned OFF. Note that, if the switch circuits 13 and 14 are absent, a high voltage of 30V cannot be applied between the source and drain of the p-channel MOS transistor 11$p$ and between the source and drain of the n-channel MOS transistor 11$n$ due to the small Zener voltage of the Zener diode 12'.

Note that, in FIG. 14A, the switch circuit 13 can be replaced by the switch circuit 13' of FIG. 11A. Also, in FIG. 14B, the switch circuit 14 can be replaced by the switch circuit 14' of FIG. 11B.

In the above-described embodiments, the semiconductor devices 2, 2', 2", 3, 3', 3", 4 and 5 are connected by the bonding wires $W_1, W_2, W_3, W_{11}, W_{12}, W_{13}, W_{14}, W_{21}, W_{22}, W_{23}$ and $W_{24}$ to the external terminals $T_1, T_2, T_3, T_{11}, T_{12}, T_{13}, T_{14}, T_{21}, T_{22}, T_{23}$ and $T_{24}$ of a lead frame, a motherboard or an interposer. However, the present invention can be applied to a flip-chip type semiconductor device (bare chip) which is connected to solder balls of a lead frame, a motherboard or an interposer without bonding wires.

It is apparent that the present invention is not limited to the above-described embodiments, but may be modified and changed without departing from the scope and sprit of the present invention.

What is claimed is:

1. A method for testing a semiconductor device that has a transistor to be protected, and a fuse and a protection circuit that are operative to electrically protect said transistor in a first state of said fuse and to electrically separate said protection circuit from said transistor in a second state of said fuse, said method comprising:
    performing a test operation upon said transistor in said second state of said fuse,
    changing said fuse from said second state to said first state, and
    wherein said second state is a conductive state.

2. The method as set forth in claim 1, wherein said changing said fuse is carried out by blowing said fuse.

3. The method as set forth in claim 2, wherein said blowing said fuse is carried out by using a laser.

4. The method as set forth in claim 1, further comprising connecting by a wire an electrode of said transistor to an external terminal in said first state of said fuse.

5. The method as set forth in claim 1, wherein:
    said transistor has first and second electrodes,
    said protection circuit is coupled between said first and second electrodes,
    said fuse is part of said switch circuit, which further comprises a resistive element connected between said second electrode and a circuit node, and a transistor having a source-drain current path connected in series between said first and second electrodes to said protection circuit and having a gate connected to said circuit node,
    said fuse is connected between said first electrode and said circuit node, and
    said switch circuit is disposed in series between said first and second electrodes to said protection circuit.

* * * * *